United States Patent
Sakuma

(10) Patent No.: US 6,639,909 B1
(45) Date of Patent: Oct. 28, 2003

(54) RECEIVER HAVING FUNCTIONS FOR CANCELLING DC OFFSET AND MEASURING CARRIER DETECTION THRESHOLD VALUE, AND CONTROL METHOD THEREOF

(75) Inventor: Shigeru Sakuma, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/396,321

(22) Filed: Sep. 15, 1999

(30) Foreign Application Priority Data

Sep. 17, 1998 (JP) .......................... 10-262177

(51) Int. Cl.[7] .................. H04J 3/06; H04B 7/212; H04B 17/00
(52) U.S. Cl. ................. 370/350; 370/347; 375/326; 455/226.2; 455/313
(58) Field of Search ................ 370/337, 347, 370/350; 375/319, 326, 328; 455/226.1, 226.2, 229, 313, 314, 207, 209

(56) References Cited

U.S. PATENT DOCUMENTS 5,204,656 A * 4/1993 Scheinert et al. ........ 340/311.1
5,493,716 A * 2/1996 Bane ........................ 455/296
5,617,060 A * 4/1997 Wilson et al. ............. 330/129
6,157,616 A * 12/2000 Whitehead ................. 370/252
6,314,278 B1 * 11/2001 Zamat ..................... 455/239.1

FOREIGN PATENT DOCUMENTS

| JP | 6-36504 | 5/1994 |
| JP | 8-242262 | 9/1996 |
| JP | 10-13482 | 1/1998 |

* cited by examiner

Primary Examiner—Vivian Chin
Assistant Examiner—Eugene Yun
(74) Attorney, Agent, or Firm—Dickstein, Shapiro, Morin & Oshinsky, LLP.

(57) ABSTRACT

An improved system and method for canceling a DC offset and measuring a carrier detection threshold value. A control circuit provides a signal based upon a frame synchronizing signal for shutting down the power to a mixer. Thereafter, at a predetermined time, the control circuit provides a signal to a DC offset cancel circuit to cancel the DC offset. Then, the control circuit provides a RSSI gate signal to a carrier detection circuit based upon the next frame synchronizing signal, for determining whether a carrier exists.

11 Claims, 5 Drawing Sheets

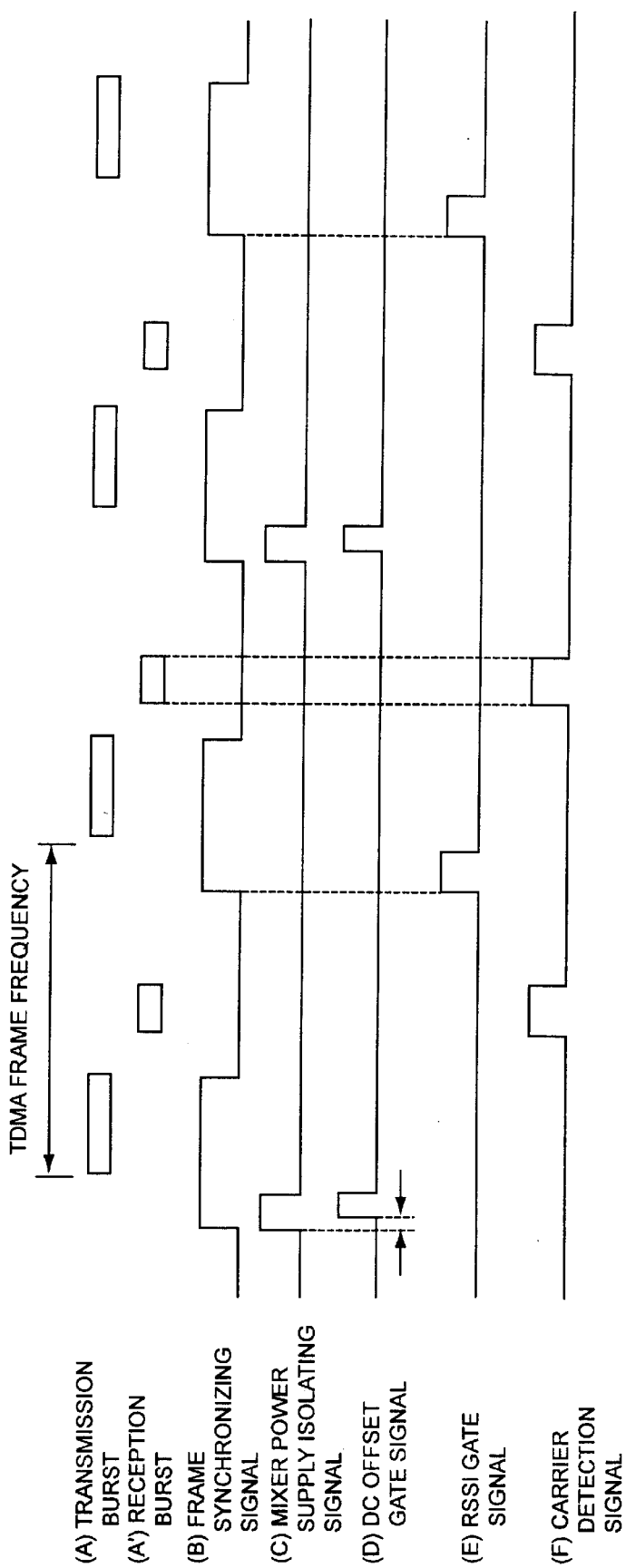

RECEIVER HAVING FUNCTIONS FOR CANCELLING DC OFFSET AND MEASURING CARRIER DETECTION THRESHOLD VALUE, AND CONTROL METHOD THEREOF

BACKGROUND OF THE INVENTION

The present invention relates to a radio communication system adopting a time-division multiple access (TDMA) method, and especially to a receiver having functions for canceling a DC offset of an input signal of a digital radio receiver and measuring a carrier detection threshold value, and a control method thereof.

Conventionally, in this kind of DC offset canceling method, in order to suppress deterioration of reception characteristic of a received signal due to a DC offset generated inside of an analog circuit by a noise, a temperature drift and so forth, in JP-A-242262/1996 for example, by providing a DC correcting circuit in the analog circuit, and further, by providing a switch for preventing an unnecessary received wave and a noise, a DC component is canceled before the received signal comes.

Also, in other example, as disclosed in JP-A-13482/1998, a DC offset removing circuit is arranged in an analog circuit and a digital circuit.

In addition to the above-described example, as an example in which a DC offset is canceled during reception of a burst, as disclosed in JP-B-36504/1994 for example, an arrangement in which a DC component is canceled by a capacitor of an analog circuit is proposed.

On the other hand, as a carrier detection method, it is known that a received signal strength indicator (RSSI) obtained by applying A/D conversion to an output of a log-amplifier in an analog circuit is compared with a preset threshold value, and in case that the RSSI exceeds the threshold value, a carrier detecting signal is output and used as a trigger of a received signal.

However, if the preset threshold value is set lower, due to an interference wave from other system, a received noise and so forth, a carrier detection signal is erroneously detected, and accordingly, there is a task that power is wasted and a received signal to be originally received is missed.

Also, to the contrary, if the preset threshold value is set higher, a received signal having the low RSSI cannot be received, and accordingly, a receiving area is narrowed.

The first task is that in the method of detecting a DC offset before a received signal, in which the DC offset generated in an analog circuit is detected by preventing an unnecessary received wave and a noise, the unnecessary received wave and noise cannot be sufficiently prevented by a switch of an RF analog circuit.

The reason thereof is that the switch cannot sufficiently block the unnecessary received wave and noise, and a correct DC offset cannot be detected due to a round path.

The second task is that, in the method in which the DC offset removing function is arranged in the analog circuit, the analog circuit becomes to be a complicated one, and also, increase of wasted power is introduced.

The reason thereof is that, in the DC offset circuit based on analog processing, the number of parts becomes to be large.

The third task is that, in the method in which the DC offset removing function is arranged in both the analog circuit and the digital circuit, it is not possible to constitute a small-sized and light receiver.

The reason thereof is that, since the number of parts becomes to be large, the circuits become to be complicated ones. The fourth task is that, in the method in which the DC offset is canceled in the digital circuit during a received burst, transmission efficiency becomes to be low.

The reason thereof is that, since extra training bits for canceling the DC offset have to be added to a head of a burst signal, an overhead other than an original data is increased.

The fifth task is that, in the carrier detection using a preset threshold value, the carriers are erroneously detected and a receiving area is narrowed. Also, it is difficult to set the threshold value in accordance with use environment. The reason thereof is that, since the threshold value is fixed, the carriers are erroneously detected due to affection by an external noise and unnecessary radio waves, and in order to take a margin for an erroneous detection of the carriers, the threshold value is set higher and the receiving area is unnecessarily narrowed.

The sixth task is that, in the case of the carrier detection method in which a threshold value is adaptively changed in accordance with reception environment, when the threshold value is measured, a power supply of the mixer included in the analog circuit cannot be sometimes cut when the DC offset detection is conducted.

The reason thereof is that, in case of taking out an RSSI from a log-amplifier taken out from an output of the above-described mixer, since the power supply of the mixer is turned off, a noise level of external environment cannot be obtained from the RSSI, and accordingly, the normal threshold value cannot be measured.

SUMMARY OF THE INVENTION

The objective of the present invention is to provide a receiver and a control method capable of detecting a high accurate DC offset.

The another objective of the present invention is to provide a cancellation circuit of a DC offset, which has a small circuit scale.

The other objective of the present invention is to provide a high efficient carrier detection system in which an erroneous detection is less and a receiving area can be broaden.

The other objective of the present invention is to provide a digital radio receiver with high quality and high reliability, in which the high accurate cancellation system of the DC offset, which has a small circuit scale, and the high efficient carrier detection system are combined.

In order to accomplish the above-described objectives, a receiver of the present invention adopts an arrangement having control means for generating a DC offset gate signal, a mixer power supply isolating signal and an RSSI gate signal based on a frame synchronizing signal, switch means for switching on and off a power supply of a mixer by means of control of the above-described mixer power supply isolating signal, DC offset cancel means for canceling a DC offset by means of control of the above-described DC offset gate signal, and carrier detecting means for measuring a threshold value for carrier detection by means of control of the above-described RSSI gate signal, and for determining whether a carrier exists.

A control method of the present invention adopts an arrangement in which, in a receiver having DC offset cancel means and carrier detection threshold value measuring means, the mixer power supply isolating signal and the DC offset gate signal output from the above-described control means are output at a TDMA frame unit alternately with the RSSI gate signal.

In the present invention, since the power supply of the mixer is turned off within a guard time period between transmitted and received bursts when the DC offset is detected, it is possible to cut unnecessary radio waves from an antenna input and a noise occurred in an analog circuit, and to detect the originally required DC offset.

Also, since the DC offset is detected within a guard time period between the transmitted and received bursts, it is not necessary to add extra training bits before the bursts only for the DC offset detection.

Moreover, since a threshold value for the carrier detection is measured within a guard time period between the transmitted and received bursts and is adaptively changed, compared with a fixed threshold value, a distance at which the carrier can be substantially detected is extended, and as a result, it is possible to broaden a communication area, and also, to prevent an erroneous detection of the carrier due to a noise and interference with other system.

Furthermore, it is possible to realize a receiver in which, by alternately conducting the cancellation of a DC offset and the measurement of a carrier detection threshold value at a TDMA frame unit, both the functions are built in.

BRIEF DESCRIPTION OF THE DRAWINGS

This and other objects, features, and advantages of the present invention will become more apparent upon a reading of the following detailed description and drawings, in which:

FIG. 5 is a view for explaining control operation for DC offset detection and threshold value calculation in a base station.

DESCRIPTION OF THE EMBODIMENTS

Next, embodiments of the present invention will be explained by referring to drawings.

Figure 1:
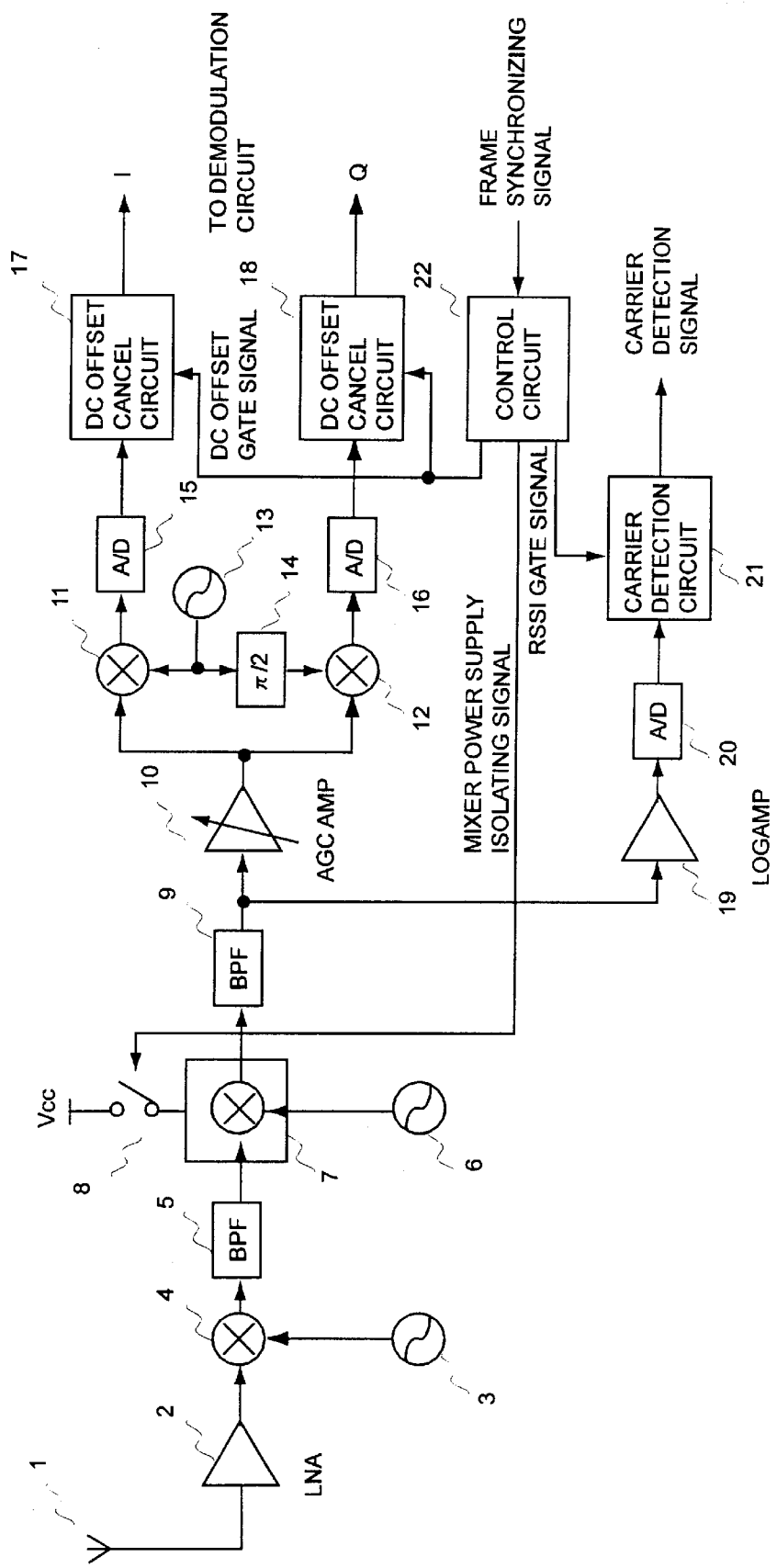
FIG. 1 is a block diagram showing a radio receiver of one embodiment of the present invention.

FIG. 1 shows an example of a double super-heterodyne system which is generally being used as a receiver of a TDMA mobile communication system. After a high frequency burst signal received from an antenna 1 is amplified by a low noise amplifier 2, it is converted into a first intermediate frequency by a local oscillator 3, a mixer 4 and a band-pass filter 5, and further, after it is converted into a second intermediate frequency by a local oscillator 6, a mixer 7 and a band-pass filter 9, it is divided into two systems through a variable gain amplifier 10.

The signal is the mixed with carrier waves at mixers 11 and 12, respectively, of which frequency are almost the same as those of second intermediate frequency signals supplied from a local oscillator 13, and frequency conversion to a base band frequency band is applied.

The local oscillator 13 is connected directly to the mixer 11, and also, is connected to the mixer 12 through a B/2 phase shifter 14. Accordingly, the signals in the two systems, which have been converted into the base band, have a phase difference of B/2 with respect to each other.

These base band signals of the two systems are A/D converted at an A/D converter 15 and 16, respectively, and an DC offset generated in an analog circuit is detected in DC offset cancel circuits 17 and 18, and it is canceled out of a received data, and is demodulated to an original data in a digital demodulation circuit (not shown).

On the other hand, in order to detect whether or not a burst reception signal exists, the second intermediate frequency signal output from the band-pass filter 9 is input to a log-amplifier 19, and further, is A/D converted in an A/D converter 20 and is input to a carrier detection circuit 21, and is output as a carrier detection signal. In a control circuit 22, each control signal is generated based on a frame synchronizing signal output from a digital base-band circuit (not shown).

One of them is a signal (mixer power supply isolating signal) for conducting switching control of the power supply of the mixer 7, and this signal is supplied to the switch 8, and also, one of them is a signal (DC offset gate signal) for controlling the DC offset cancel circuits 17 and 18, and this signal is supplied to the DC offset cancel circuits 17 and 18, and further, one of them is a signal (RSSI gate signal) for controlling the carrier detection circuit 21, and this signal is supplied to the carrier detection circuit 21.

Figure 2:
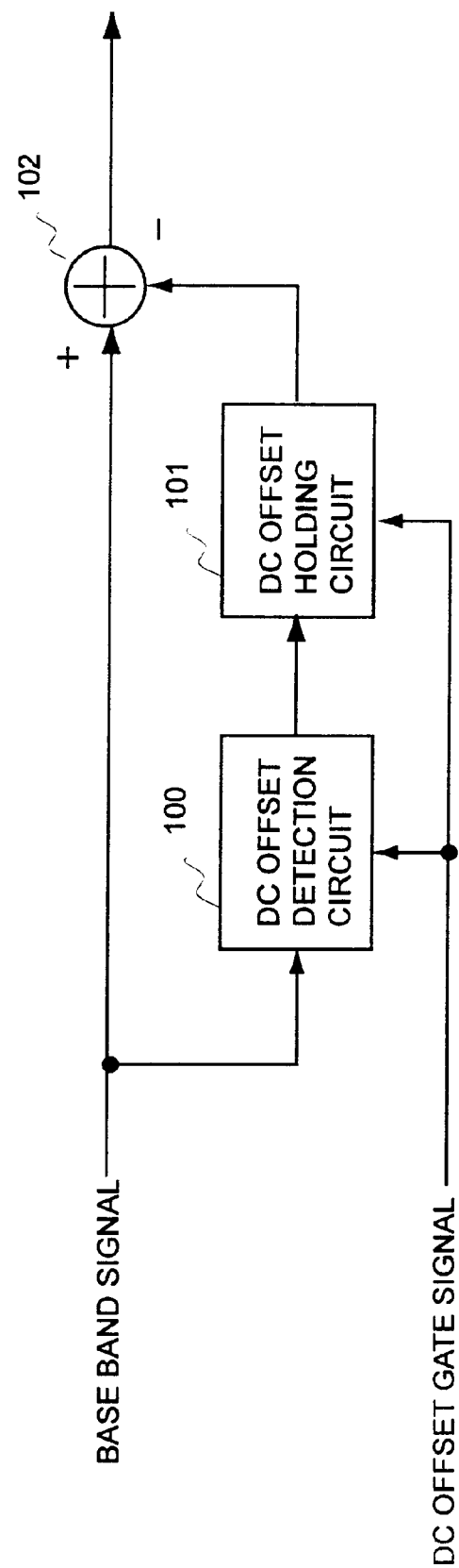
FIG. 2 is a block diagram showing an arrangement of the DC offset cancel circuits in one embodiment of the present invention.

FIG. 2 is a view showing an arrangement of the DC offset cancel circuits 17 and 18 of FIG. 1.

The base band signal (an in-phase component I signal and an orthogonal component Q signal) output from the A/D converters 15 and 16 detects in a DC offset detection circuit 100 DC offsets superimposed into each base band signal, and each of the DC offsets is hold in a DC offset holding circuit 101. This held DC offsets are subtracted from the base band signal by a subtracter 102 during reception of a burst.

The DC offset gate signal output from the control circuit 22 is input to the DC offset detection circuit 100 and the DC offset holding circuit 101.

Figure 3:
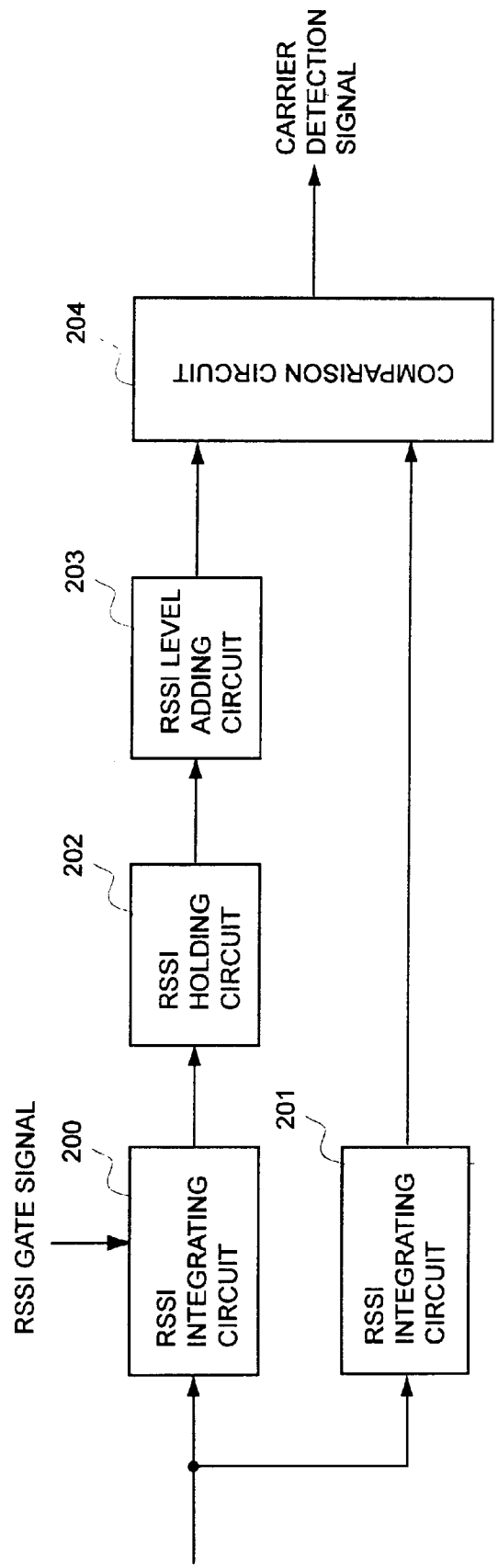
FIG. 3 is a view showing an arrangement of the carrier detection in one embodiment of the present invention.

FIG. 3 is a view showing an arrangement of the carrier detection 21 of FIG. 1.

The RSSI signal output from the A/D converter 20 is input to each of RSSI integrating circuits 200 and 201. The RSSI integrating circuit 200 smoothes a noise level change by integrating the RSSI during a fixed interval in an interval when a received burst signal does not come, and this value is held in an RSSI holding circuit 202 until the next integration, and this value is made to be a threshold value of the carrier detection through an RSSI level adding circuit 203 for increasing this level by a certain set value.

On the other hand, the RSSI integrating circuit 201 always integrates the RSSI and smoothes a noise level change, and its output signal is compared with the above-described threshold value in a comparison circuit 204, and as a result, is output from the comparison circuit 204 as a carrier detection signal for notifying whether or not a carrier exists.

Figure 4:
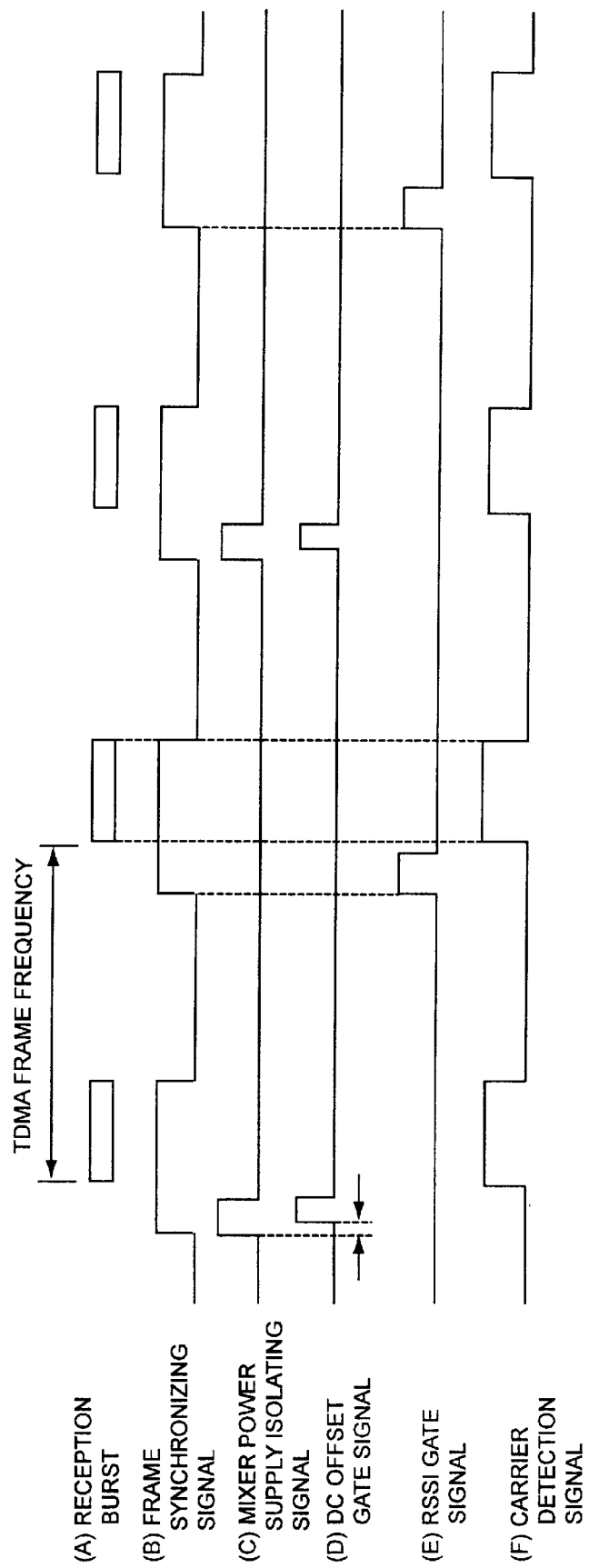
FIG. 4 is a view for explaining control operation for DC offset detection and threshold value calculation in a base station.

Next, operation of this embodiment shown in FIG. 1 will be explained together with a waveform view of FIG. 4. FIG. 4 shows an example of condition that a mobile terminal which exists in a receiving area of a base station receives a periodical reception signal from the base station.

Referring to FIG. 4, a reception burst (A) input from the antenna 1 is received at a TDMA frame period and is demodulated in order.

A frame synchronizing signal (B) notified from a digital base band circuit (not shown) is a signal synchronized with a TDMA frame, which rises during a guard time period (between a transmission and reception burst and a transmission and reception burst) before the reception burst signal (A), and falls at the end of the reception burst signal, and an edge of this rise becomes to be a trigger and a mixer power supply isolating signal (C), a DC offset gate signal (D) and an RSSI gate signal (E) are output from the control circuit 22.

The mixer power supply isolating signal (C) is connected to the switch 8, and turns off the power supply of the mixer for a fixed period of time during the guard time period.

Also, the DC offset gate signal (D) is input to the DC offset cancel circuits 17 and 18, and when the power supply of the mixer is turned off, the DC offset is detected.

In particular, after the DC offset detection circuit 100 waits for a predetermined time period during which the mixer power supply isolating signal becomes active (the power supply of the mixer is turned off) and a power supply change due to the mixer power supply isolation is stable, in order to smooth a noise level, the DC offset detection circuit conducts integration of base band signals (I and Q signals) during a time period when the DC offset signal is active, and detects the DC offset.

Furthermore, the detected DC offset component is held by the DC offset holding circuit 101 during a period of time when the DC offset gate signal is non-active, and by subtracting the DC offset from the received base band signal by the subtracter 102, it is possible to send a base band signal to a digital demodulation circuit (not shown), in which the DC offset generated in an analog circuit is canceled and there is no distortion.

On the other hand, the RSSI gate signal (E) is input to the carrier detection circuit 21, and becomes to be active during a guard time period, and the RSSI signal is integrated during an active period of time, and smoothing of a noise level change is conducted.

This value is held in the RSSI holding circuit 202 until the next integration, and further, in order to reduce erroneous detection due to a noise, a level is increased by a certain set value through the RSSI level adding circuit 203, and the value is made to be a threshold value for carrier detection.

For example, as a particular example, assuming that amplitude resolution of the RSSI (resolution of the A/D converter 20) is 32 levels from 0 to 31 and that a set value of the RSSI level adding circuit is 2 levels, when a result of an integration calculation in the RSSI integrating circuit 200 is 3 levels, 5=3+2 levels are set as a threshold for the carrier detection.

Also, the RSSI integrating circuit 201 always integrates the RSSI and conducts smoothing of a noise level change, and its output signal is compared with the above-described threshold value in the comparison circuit 204, and if it is larger than the threshold value, it is determined that a carrier exists, and a carrier detecting signal (F) is output, which becomes to be active in an interval in which the reception burst is being received.

Referring to FIG. 4, the mixer power supply isolating signal (C) and the DC offset gate signal (D) operate at a TDMA frame unit alternately with the RSSI gate signal (E).

The reason for this is that the following problem occurs: In FIG. 1, since the RSSI signal is taken out from a latter stage of the mixer 7, of which power supply is controlled, when the mixer power supply isolating signal (C) becomes to be active, the power supply of the mixer 7 is turned off, and radio environment such as an external noise input from the antenna 1 and an interference wave from other radio system cannot be measured, and a correct threshold value cannot be set.

Usually, the DC offset and the carrier detection threshold value slowly change. However, since they do not rapidly change at a frame unit, there can be no harm even though a data is updated at two frame units.

Although FIG. 4 explained above is a view showing control operation of the mobile terminal, as another operation example, control operation for DC offset cancel and carrier detection threshold value measurement in a base station is shown in FIG. 5.

Referring to FIG. 5, the base station periodically transmits a transmission burst (A) at a TDMA frame period, and also, a frame synchronizing signal (B) notified from a digital base band circuit (not shown) in a receiving area is a signal synchronized with a TDMA frame, which rises during a guard time period (between a transmission and reception burst and a transmission and reception burst) before the transmission burst signal (A), and falls at the end of the transmission burst signal, and an edge of this rise becomes to be a trigger and a mixer power supply isolating signal (C), a DC offset gate signal (D) and an RSSI gate signal (E) are output from the control circuit 22.

If a transmitted signal from a mobile terminal is input to the base station as a reception burst (A') during a TDMA frame period, by using a threshold value measured by means of the previous RSSI gate signal (E), a carrier detection signal (F) is output.

The first effect is to improve a detection accuracy of the DC offset. Accordingly, reliability of the receiver is improved.

The reason thereof is that the power supply of the mixer is directly turned off to detect the DC offset.

The second effect is that a training bit for the DC offset detection before a transmission and reception burst is not needed. Accordingly, an overhead is reduced, and a transmission speed of the radio communication system is improved.

The reason thereof is that the DC offset is detected during a guard time period between transmission and reception bursts. The third effect is that erroneous detection of carrier detection can be prevented, and a communication area is broadened. Accordingly, reliability and performance of the receiver are improved.

The reason thereof is that a threshold value of the carrier detection is measured during a guard time period between transmission and reception bursts, and can be adaptively changed.

The fourth effect is that characteristic and performance of the receiver are improved and reliability is improved. Also, the receiver becomes to be compact and to have a light weight. The reason thereof is that, by means of a digital calculation, the DC offset detecting function and the carrier detecting function are realized, and alternately operate at the TDMA frame unit.

The entire disclosure of Japanese Patent Application No. 10-262177 filed on Sep. 17, 1998 including specification, claims, drawing and summary are incorporated herein by reference in its entirety.

What is claimed is:

1. A receiver for a time-division multiple access (TDMA) system, comprising:

a controller, said controller generating a mixer power supply isolating signal, a DC offset gate signal and an RSSI gate signal based on a frame synchronizing signal;

a switch, said switch switching a power supply of a mixer on and off based on said mixer power supply isolating signal;

a DC offset cancel circuit, said DC offset cancel circuit canceling a DC offset generated at an A/D converter as a function of said DC offset gate signal; and a carrier detection circuit, said carrier detection circuit determining whether a carrier exists as a function of both an RSSI signal and said RSSI gate signal.

2. The receiver according to claim 1, wherein said switch is provided at a power supply side of said mixer, said DC offset cancel circuit is provided at a forward stage of a demodulating circuit and said carrier detection circuit is provided between an output side of said mixer and said controller.

3. The receiver according to claim 1, wherein said mixer power supply isolating signal, said DC offset gate signal and said RSSI gate signal are generated within a guard time period between transmitted and received bursts.

4. The receiver according to claim 1, wherein said DC offset cancel circuit comprises a DC offset detecting circuit, a DC offset holding circuit and a subtracter, and both signals of an A/D converted base band signal and a DC offset signal processed through said DC offset detecting circuit and DC offset holding circuit are input to said subtracter and subtraction process is applied to the signals, and control of said DC offset detecting circuit and DC offset holding circuit is conducted by said DC offset gate signal.

5. The receiver according to claim 1, wherein:

said carrier detection circuit comprises two RSSI integrating circuits, an RSSI holding circuit, an RSSI level adding circuit and a comparison circuit;

a carrier signal output from said mixer is directly input to said comparison circuit through one of said RSSI integrating circuits and is input to said comparison circuit through the other of said RSSI integrating circuits, said RSSI holding circuit and said RSSI level adding circuit;

a determination as to whether a carrier exists is made at said comparison circuit and a carrier detecting signal is generated as a function thereof; and said other of RSSI integrating circuits is controlled as a function of said RSSI gate signal.

6. A receiver for a time-division multiple access (TDMA) system, comprising:

control means for generating a mixer power supply isolating signal, a DC offset gate signal and an RSSI gate signal based on a frame synchronizing signal;

switch means for turning a power supply of a mixer on and off based on said mixer power supply isolating signal;

DC offset cancel means for canceling a DC offset generated at an A/D converter as a function of said DC offset gate signal, and carrier detection for means determining whether a carrier exists as a function of both an RSSI signal and said RSSI gate signal.

7. A control method of a receiver for a time-division multiple access (TDMA) system, comprising the steps of:

generating a mixer power supply isolating signal, a DC offset gate signal and an RSSI gate signal based on a frame synchronizing signal;

turning a power supply of a mixer on and off based on said mixer power supply isolating signal;

canceling a DC offset generated at an A/D converter based on said DC offset gate signal; and determining whether a carrier exists as a function of both an RSSI signal and said RSSI gate signal.

8. The control method of the receiver according to claim 7, wherein said step of measuring is measurement within a guard time period between transmitted and received bursts, and is adaptively changed.

9. The control method of the receiver according to claim 7, wherein said mixer power supply isolating signal and said DC offset gate signal are generated at a frame period unit alternatively with the RSSI gate signal.

10. The control method of the receiver according to claim 7, wherein said DC offset gate signal rises after said mixer power supply isolating signal rises and the mixer power supply is stabilized.

11. The control method of the receiver according to claim 7, wherein said mixer power supply isolating signal, said DC offset gate signal and said RSSI gate signal are alternately output at a TDMA frame unit.

* * * * *